United States Patent [19]

Hayashi et al.

[11] Patent Number: 5,122,482

[45] Date of Patent: Jun. 16, 1992

[54] METHOD FOR TREATING SURFACE OF SILICON

[75] Inventors: Yutaka Hayashi, Tsukuba; Yasushi Kondo, Tokyo, both of Japan

[73] Assignees: Agency of Industrial Science & Technology; Ministry of International Trade & Industry, both of Tokyo, Japan

[21] Appl. No.: 498,221

[22] Filed: Mar. 23, 1990

[30] Foreign Application Priority Data

Mar. 31, 1989 [JP] Japan .................................. 1-81775

[51] Int. Cl.⁵ ..................... H01L 21/00; H01L 21/02; H01L 21/205
[52] U.S. Cl. .................................. 437/225; 437/228; 148/DIG. 17; 156/643; 156/646; 427/36; 427/38; 427/39
[58] Field of Search .................. 437/225, 228; 427/36, 427/38, 39, 54.1; 156/643, 646; 148/DIG. 17

[56] References Cited

U.S. PATENT DOCUMENTS

| | | | |
|---|---|---|---|
| 4,247,859 | 1/1981 | Rai-Choudhury et al. | 357/4 |
| 4,329,699 | 5/1982 | Ishihara et al. | 204/192.25 |
| 4,363,828 | 12/1982 | Brodsky et al. | 427/39 |
| 4,745,088 | 5/1988 | Inoue et al. | 437/225 |
| 4,840,921 | 6/1989 | Matsumoto | 437/108 |
| 4,923,828 | 5/1990 | Gluck et al. | 156/643 |

FOREIGN PATENT DOCUMENTS

| | | | |
|---|---|---|---|
| 0207331 | 12/1982 | Japan | . |
| 3155611 | 6/1988 | Japan | 427/36 |
| 0301588 | 12/1989 | Japan | . |

Primary Examiner—Brian E. Hearn
Assistant Examiner—B. Everhart
Attorney, Agent, or Firm—Oblon, Spivak, McClelland, Maier & Neustadt

[57] ABSTRACT

In a method for treating the surface of either crystalline or amorphous silicon a silicon material is maintained in a non-oxidizing atmosphere with a reduced pressure, a gas selected from among hydrides of phosphorus, fluorides of phosphorus, hydrides of arsenic, fluorides of arsenic, hydrides of boron, fluorides of boron and fluorides of silicon is excited and the excited gas is supplied onto the surface of the silicon material for a prescribed period of time. During this period the temperature of the silicon material is maintained within a range higher than the temperature at which the molecules of the selected gas would, were the gas not excited, liquefy at the reduced pressure and deposit on the material and lower than the temperature at which the gas decomposes. The method enables the silicon material surface to be cleaned and/or protected by treatment at a relatively low temperature. The treatment has the effect of improving various electrical, chemical and physical characteristics of the surface of silicon material and as such improves the performance and characteristics of a device or integrated circuit including the silicon material.

37 Claims, 4 Drawing Sheets

METHOD FOR TREATING SURFACE OF SILICON

BACKGROUND OF THE INVENTION

1. Field of the Invention

This invention relates to a method for treating the surface of crystalline silicon (c-Si) and amorphous silicon (a-Si) and more particularly to such a method which provides improved effect in impurity removal processing and surface protection processing by adhesion of phosphorus, boron, arsenic or the like.

2. Prior Art Statement

Cleaning techniques are coming to play an increasingly important role in the production of high-density, high-performance semiconductor elements. This is particularly true of crystalline silicon and amorphous silicon for use as device substrates since the cleanness of the surface of these materials can greatly affect the product yield and performance. It has therefore long been the practice to take utmost care in this respect.

However, even crystalline silicon substrates and amorphous silicon substrates that have been transported through clean air and been washed with pure water soon suffer chemical bonding to their surfaces of a natural oxide film layer or of carbon compounds, sodium and other impurities to a thickness of several atoms.

Because of this, it has been the practice in the case of crystalline silicon substrates, for instance, to remove mainly such impurities as oxygen and carbon from the substrate surface by heating the substrate to over 900° C. in an ultra-high vacuum exceeding $10^{-8}$ Torr, thereby sublimating these impurities along with the oxide film.

While this high-vacuum processing is suitable as a pretreatment for molecular beam epitaxy (MBE), it is not adaptable for use with chemical vapor deposition (CVD) in which a gas source is used. Therefore, as a pretreatment for CVD, it has been the practice to remove the surface to an appropriate thickness by an etching removal process in which a gas such as of chlorine ($Cl_2$) or hydrochloric acid (HCl) is passed over the surface of the crystalline silicon held at a high temperature, generally in the vicinity of 900° C.

When such a sublimation method is carried out in a high-temperature, ultra-high vacuum environment, however, impurities released from the alumina or boron nitride (BN) support for the heater for heating the crystalline silicon being treated diffuse into the substrate or are included in the growth layer and have an adverse effect on the electrical properties. For example, in the case of a Schottky junction, ohmic contact or the like, it may be impossible to obtain the desired properties of the junction formed at the interface between the substrate and the growth layer, or, generally, a large number of lattice defects occur in the growth layer, making it impossible to grow a good quality crystal.

On the other hand, as an improvement in the etching removal technique, there has recently been developed a method in which surface treatment is carried out with a mixed gas of hydrogen and chlorine under reduced pressure at a relatively low temperature between 500° and 600° C. In fact, however, this improved method has difficulty severing the strong bond between silicon and oxygen and further entails a problem regarding maintenance of the equipment used since the chlorine and hydrogen chloride gases tends to corrode the piping and metal chamber of the equipment.

These two conventional methods are, moreover, limited in application to crystalline silicon type materials and are totally unusable with amorphous silicon type materials because of their excessively high treatment temperatures.

OBJECT AND SUMMARY OF THE INVENTION

One object of the invention is to provide a method for treating the surface of silicon which can be conducted at a low temperature and without need for an ultra-high vacuum environment and which can, therefore, be applied to both crystalline silicon type materials and amorphous silicon type materials.

Another object of the invention is to provide such a method which uses a gas with less corrosiveness than chlorine gas, hydrogen chloride gas and like gases for treating the surface of a crystalline or noncrystalline silicon surface, removing oxygen, carbon and other impurities therefrom, and providing protection therefor.

For achieving this purpose, the present invention provides a method for treating the surface of silicon wherein the silicon material to be treated, which may be crystalline or noncrystalline, is first maintained in a non-oxidizing atmosphere with a reduced pressure, and while being heated in this state is supplied on its surface with one excited gas selected from among 1) hydrides and fluorides of phosphorus, 2) hydrides and fluorides of arsenic, 3) hydrides and fluorides of boron, and 4) fluorides of silicon.

During this treatment, the temperature to which the silicon material is heated (the temperature at which it is maintained) is selected to be higher than the temperature at which the molecules of the selected gas would, were the gas not excited, liquefy and deposit on the material and lower than the temperature at which the gas decomposes.

While the basic method for treating the surface of silicon is as described above, the invention further extends to immediately ensuing treatments such as that of growing on the treated silicon surface a crystalline semiconductor layer of, for example, crystalline silicon or crystalline gallium arsenide, adhering to the silicon material a substance which forms a rectifying junction or ohmic contact therewith, or causing amorphous semiconductor material to deposit thereon.

The invention also extends to a two-step surface treatment method wherein the aforesaid method is conducted in what will be called "the first surface treatment" and then, after the silicon material that was treated in the first surface treatment has stood in an unclean atmosphere, carrying out a second surface treatment consisting of merely heat treating the silicon material in a reduced pressure atmosphere. The reason why the second surface treatment may consist of merely heating the silicon material is that the first surface treatment has a protective effect with respect to the surface of the material.

In the method according to this invention, the limiting of the temperature range to higher than the temperature at which the molecules of the selected gas would, were the gas not excited, liquefy and deposit on the material and lower than the temperature at which the gas decomposes enables application of the method beyond crystalline silicon materials to amorphous silicon materials, which require lower temperature treatment. Moreover, the excited gas exhibits adequate cleansing and protection effects with respect to the surface of the silicon material even at such a relatively low temperature.

It is therefore possible to greatly suppress the generation of lattice defects in a crystalline layer grown on the treated silicon surface regardless of whether the method used for growing the layer is MBE or CVD. In the case of treating an amorphous silicon material, it is possible to reduce the level of undesired impurity atoms at the interface between the material and a thin film deposited thereon.

These effects of the invention result in an improvement in the characteristics of various semiconductor elements formed on a silicon substrate treated by the method disclosed herein and, as a result, to higher productivity and better characteristics for electrical devices and integrated circuit.

The above and other features of the present invention will become apparent from the following description made with reference to the drawings.

DETAILED DESCRIPTION OF THE PREFERRED EMBODIMENT

Figure 1:
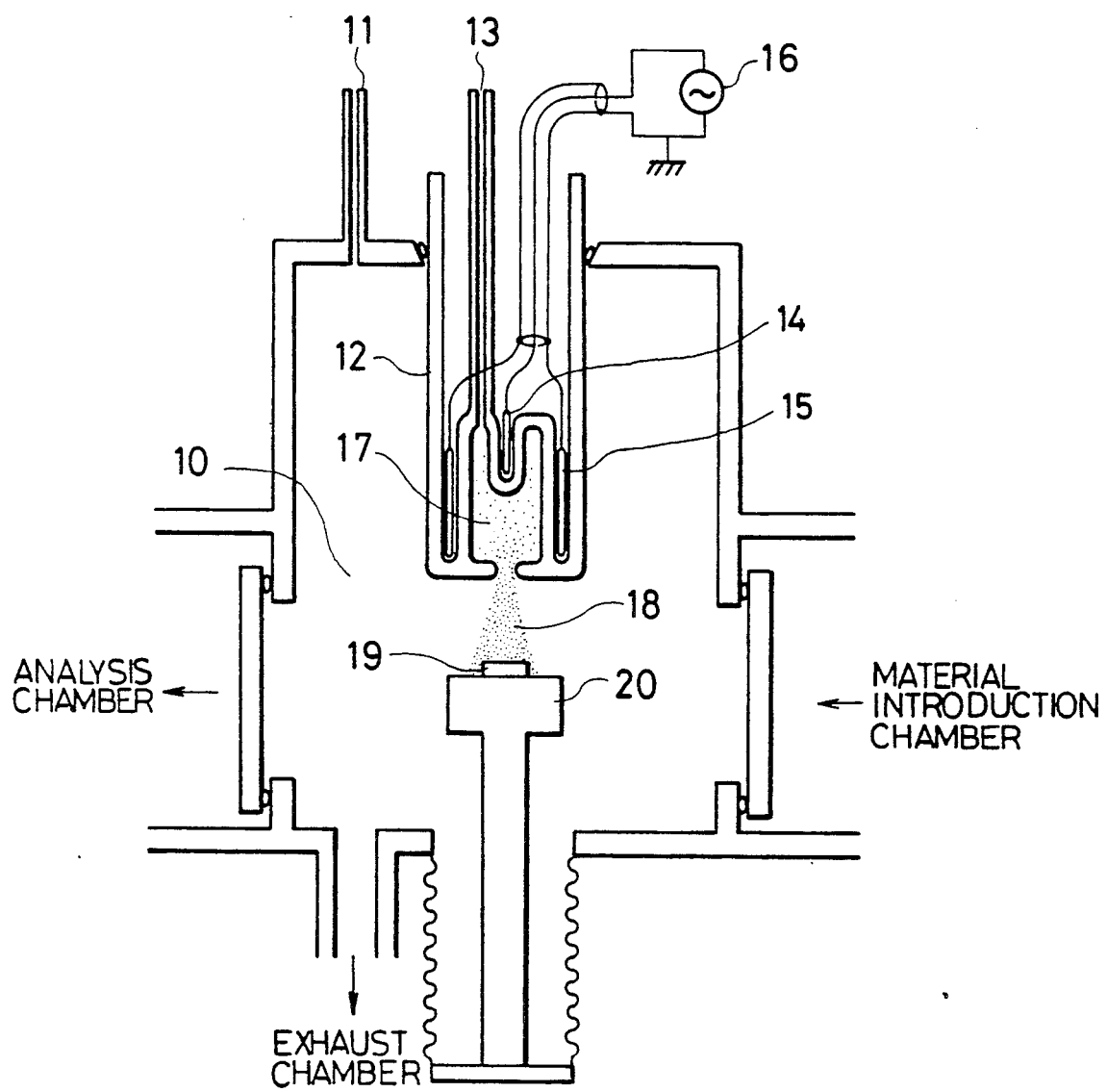
FIG. 1 is an example of a silicon surface processing apparatus suitable for carrying out the method of the present invention.

FIG. 1 shows an example of the structure of an apparatus suitable for carrying out the method of the present invention.

As one example of the method according to this invention, there will be explained the procedures that the inventor used for surface treating a crystalline silicon specimen 19 using the apparatus shown in FIG. 1.

First the crystalline silicon specimen 19 was retained on a holder 20 disposed within a processing chamber 10 and capable of heating the crystalline silicon specimen 19. After the air had been evacuated from the interior of the processing chamber 10, hydrogen was introduced into the chamber as the environmental gas through a gas inlet pipe 11. The crystalline silicon specimen 19 was then heated to 300° C. At this time, the hydrogen flowrate was 300 cc/min and the evacuation rate was adjusted by a hydraulic rotary pump (not shown) so as to maintain a degree of vacuum of 3 Torr within the processing chamber 10. Once the specimen temperature had stabilized, a 1 % hydrogen-diluted phosphine(PH$_3$) gas was introduced through a gas inlet pipe 13 into the plasma chamber 17 of a hollow cathode type plasma generator 12 at the rate of about 30 cc/min. The hollow cathode type plasma generator 12 was equipped on the atmospheric side with a center electrode 14 and a shield electrode 15. By applying a high frequency wave from an external high frequency power supply 16 across these two electrodes, it was possible to excite into a plasma state the phosphine gas introduced from the gas inlet pipe 13 into the plasma chamber 17 established on the vacuum side by a quartz wall separating it from the atmospheric side. The phosphine plasma 18 generated in this manner was, in the illustrated example, jetted through a downward-facing opening in the plasma chamber 17 onto the crystalline silicon specimen 19 disposed at a distance of about 5 cm. In the example under discussion, once the flow rate of the phosphine from the gas inlet pipe 13 had stabilized at the aforesaid value, the high frequency wave from high frequency power supply 16 was applied to generate plasma 18. The crystalline silicon specimen 19 was thereafter exposed to the plasma stream for 10 min. Upon completion of the plasma exposure, the supply of phosphine was discontinued and the crystalline silicon specimen 19 was allowed to stand in a hydrogen atmosphere for 10 min. Then with the hydrogen atmosphere maintained, the temperature was lowered to room temperature with the vacuum degree maintained at 3 Torr.

The procedures up to this point constitute one embodiment of the silicon surface treatment method of the present invention. For ascertaining the effect of the treatment, the crystalline silicon specimen 19 cooled in accordance with the aforesaid procedures was transferred to an analysis chamber (not shown) after the processing chamber 10 had been evacuated to a high degree of vacuum on the order of $10^{-7}$ by a turbo molecular drag pump. The surface of the treated crystalline silicon specimen 19 was observed in the analysis chamber by Auger electron spectroscopy (AES) and ultraviolet photoemission spectroscopy (UPS).

The results of this observation are shown in FIG. 2. FIG. 2(A) shows the AES signal obtained immediately after removal of the natural oxide film from a crystalline silicon specimen using dilute hydrofluoric acid, while FIG. 2(B) shows the AES signal obtained after the so-treated crystalline silicon specimen was plasma treated according to this invention. Comparing the two graphs, it will be noted that, in contrast to the results prior to plasma processing, the oxygen peak O and the carbon peak C have fallen to mere noise level, while a peak P appears because the surface is coated with phosphorus (P). The silicon surface cleaning effect of the invention can thus be clearly noted.

Figure 2A:
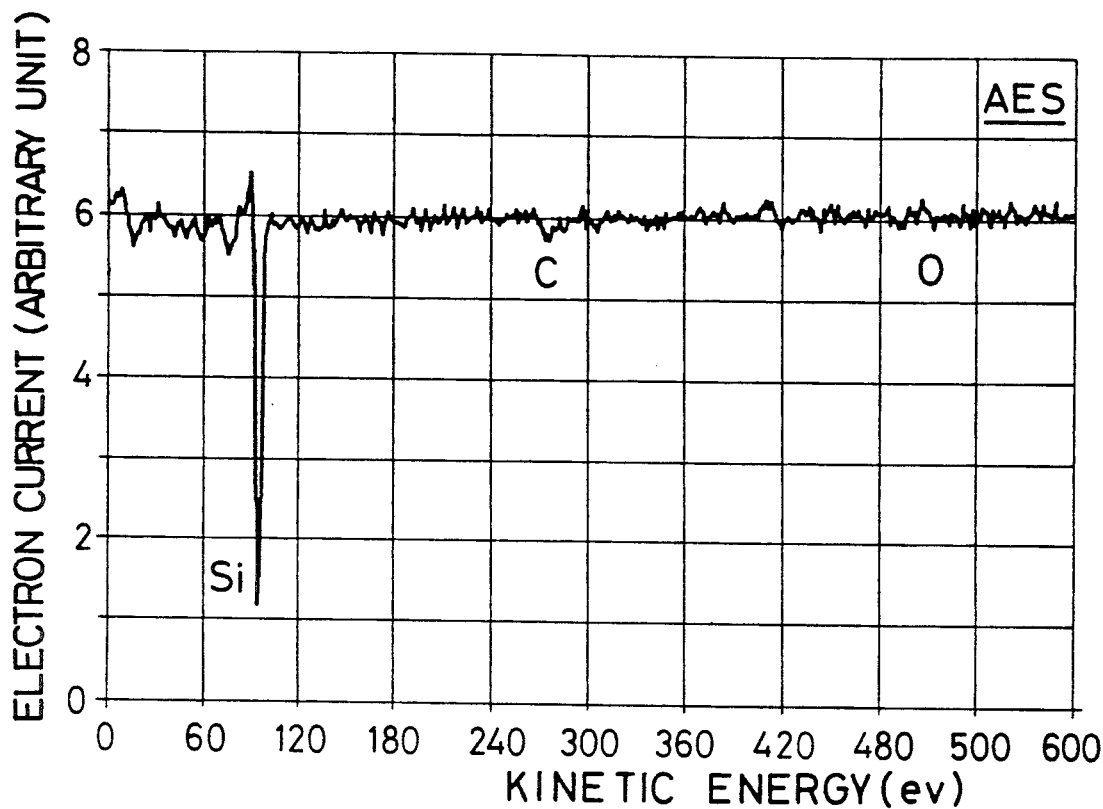
FIGS. 2(A) and (B) and FIGS. 2(C) and 2(D) are graphs showing the characteristics of a specimen surface obtained by Auger electron spectroscopy and ultraviolet photoemission spectrography, respectively, for demonstrating the effect of the invention.
Figure 2B:
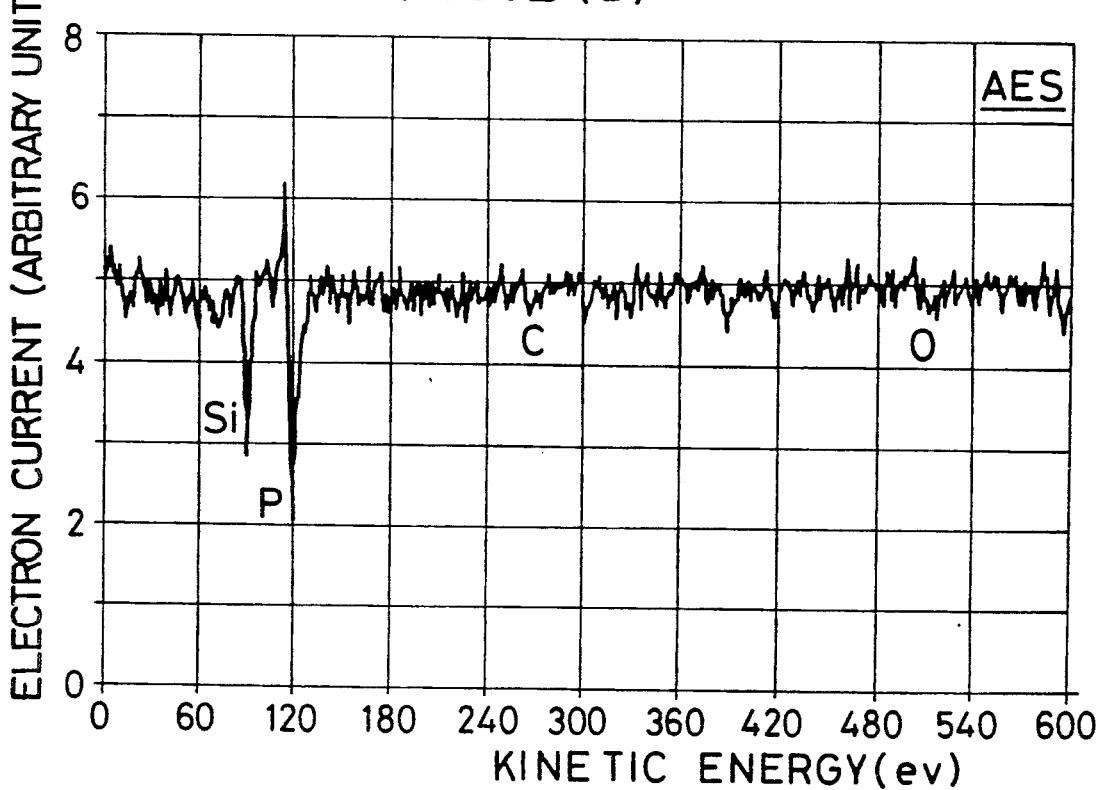
Figure 2C:
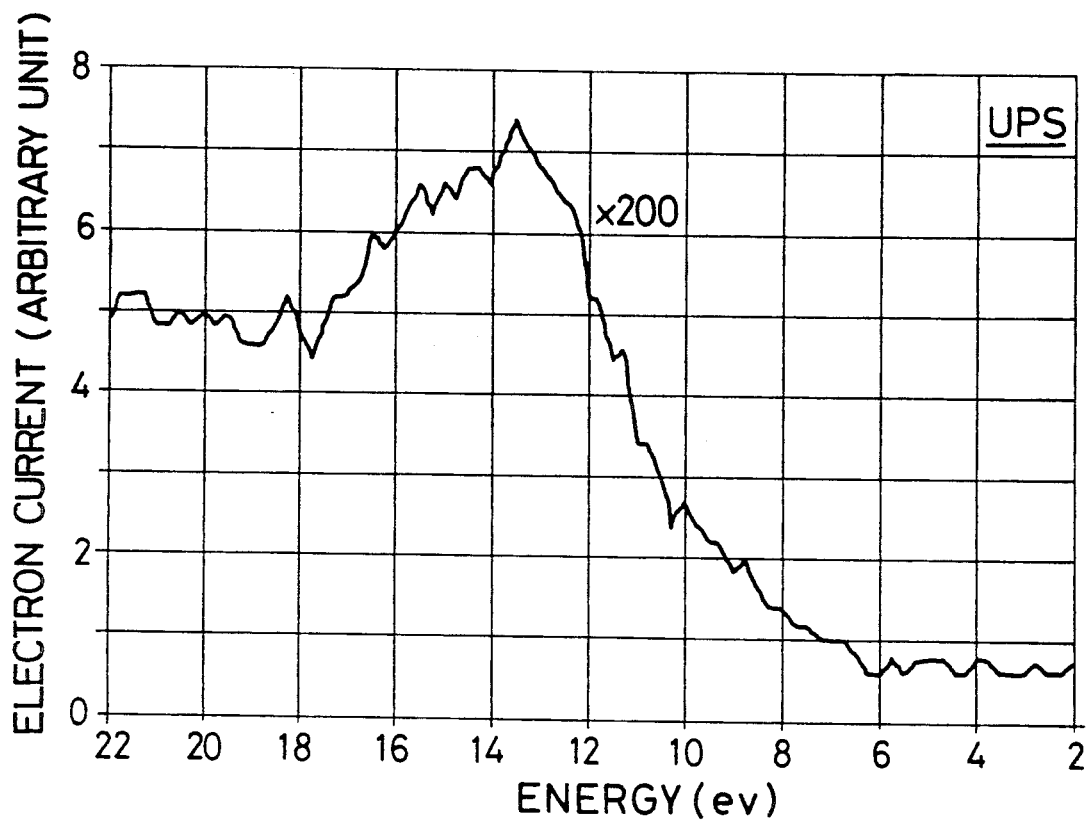
Figure 2D:
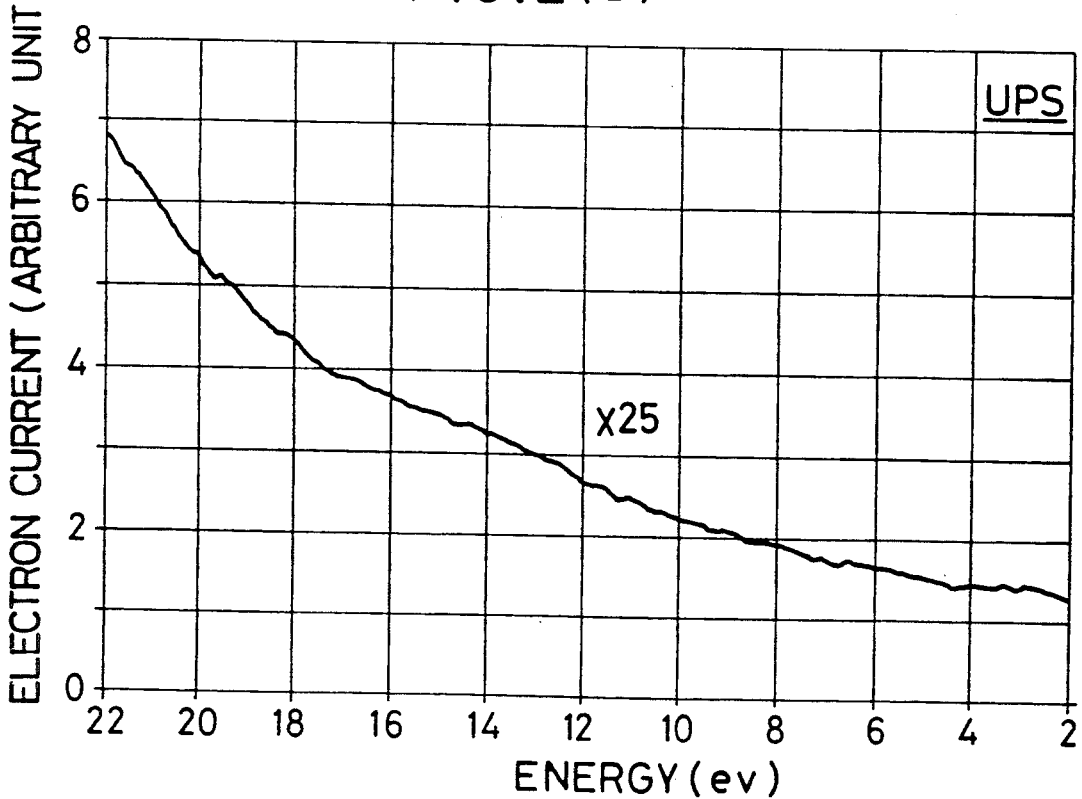

FIGS. 2(C) and 2(D) are similarly graphs showing the UPS signal before plasma treatment and the UPS signal after plasma processing. It will be noted that the peak in FIG. 2(C) caused by the oxide film has disappeared in FIG. 2(D), again demonstrating the effectiveness of the plasma treatment according to the present invention.

Although the plasma spreads more widely at lower pressure and is more confined at higher pressure, similar results are obtained within the chamber pressure range of 0.1-5 torr and specimen temperature range of 150-300° C.

After having been processed according to the method of this invention, the crystalline silicone material can be immediately used without further processing as the substrate in the next step of the process for producing a semiconductor device.

For example, a silicon substrate processed using phosphine gas in the foregoing manner can first be heated to 400°-500° or higher for sublimation of the phosphorus thereon and then have an appropriately selected semiconductor such as gallium arsenide (GaAs) or gallium phosphide (GaP) epitaxially grown thereon by the MBE method. It is well known that the crystalline characteristics of a crystalline layer epitaxially grown on a silicon substrate are extremely sensitive to the initial condition of the silicon substrate surface. Since a silicon substrate that has been surface treated in accordance with the series of steps, including plasma treatment, of the present invention has had its surface cleaned at the atomic level, the characteristics of any crystalline layer epitaxially grown thereon will exhibit very high quality and few defects.

Further, when a crystalline silicon substrate 19 that has been plasma treated in the aforesaid manner is maintained in the temperature range of 450°–500° C., is then deposited with amorphous silicon by having disilane gas ($Si_2H_6$) passed thereover at reduced temperature, and is thereafter allowed to stand for several hours in an inert atmosphere at about 600° to 700° C., crystalline silicon forms from the amorphous silicon by solid phase growth. In this case also, since the plasma treatment using phosphine gas according to this invention ensures that there will be no thin oxide film to impair the crystalline characteristics at the interface between the initial amorphous silicon and crystalline silicon substrate, the layer of crystalline silicon formed by solid phase growth will have much better crystalline characteristics than would be the case should the plasma treatment according to this invention not be carried out.

It is further possible to fabricate a solar cell by plasma treating a crystalline silicon substrate in the above described manner and then depositing thereon a layer of amorphous silicon that has been doped so as to form a junction with the silicon substrate.

For ascertaining the effect of the invention in this case, p-type crystalline silicon substrates were, in accordance with their surface treatment conditions, used to prepare four specimen groups.

Specifically, a number of specimens were immersed in a solution consisting of four parts water, one part hydrogen peroxide and one part hydrochloric acid so as to chemically form a thin oxide film on the surface thereof in advance. Specimens of this type not subjected to further treatment were designated as group A.

Group B specimens were obtained by immersing some of the specimens of group A in dilute hydrofluoric acid for once removing the oxide film. It should be noted, however, that a natural oxide film immediately formed on the surface of the silicon substrates of group B.

Group C specimens were obtained by treating some of the group A specimens with phosphine plasma in accordance with this invention, while group D specimens were obtained by similarly treating some of the specimens of group B.

The phosphine plasma treatment of the specimens of groups C and D was conducted by heating the specimen to 250° C., maintaining the hydrogen-diluted 1% phosphine gas at a degree of vacuum of 1 Torr, applying a 13.56 MHz, 15 W high frequency wave across 21 cm$\phi$ parallel flat electrodes, and maintaining exposure to the generated plasma for 5 min.

The n-type silicon substrate specimens of all groups were fabricated into solar cells by using a plasma of hydrogen-diluted monosilane ($SiH_4$) doped with phosphine to deposit n-type amorphous silicon thereon to a thickness of approximately 50 nm, thus forming a pn junction with the p-type silicon substrate, and then providing a transparent electrode by further vapor depositing thereon indium tin oxide (ITO) to a thickness of about 90 nm.

Figure 3:
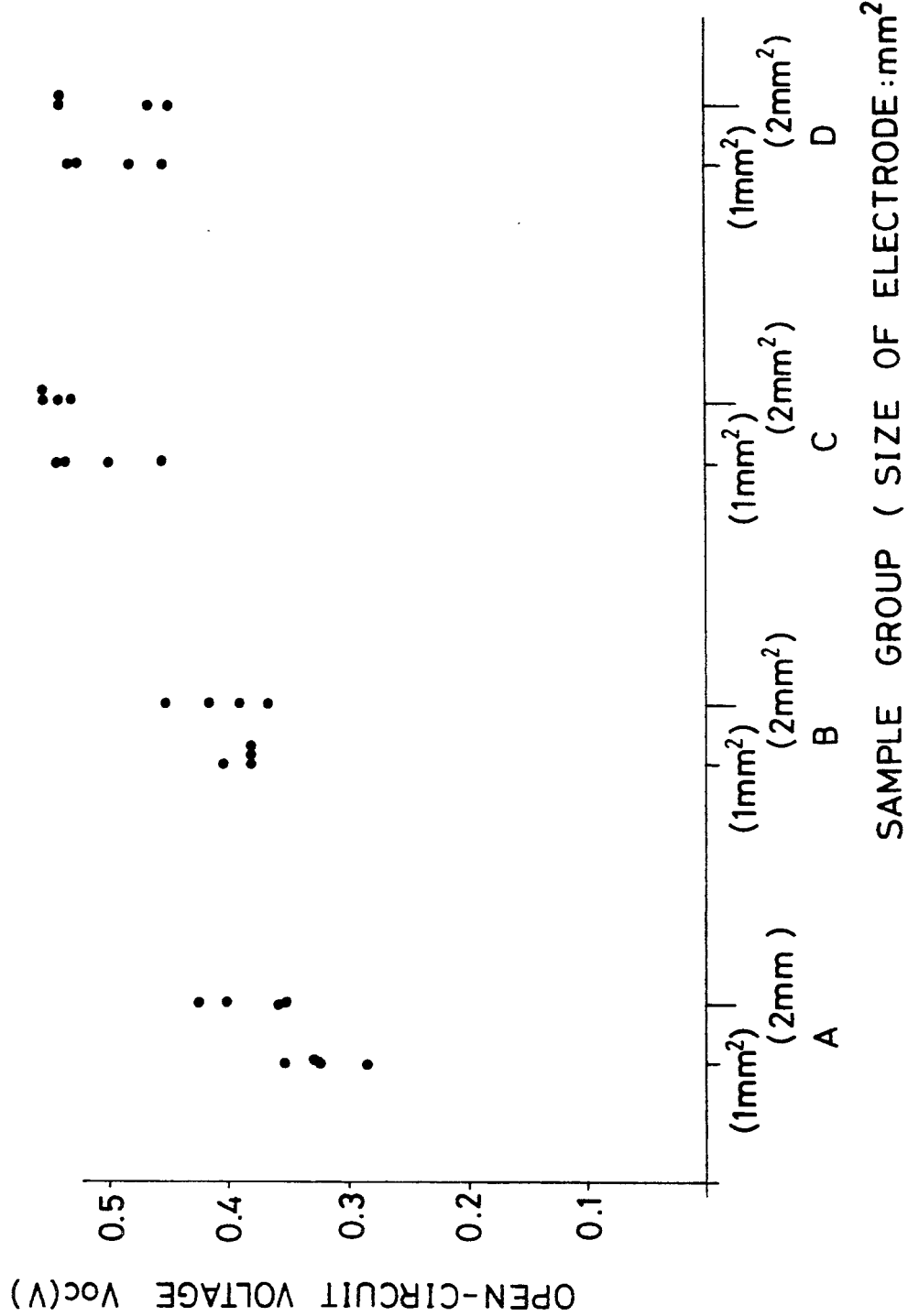
FIG. 3 is a graph showing the open-circuit voltage characteristics of solar batteries fabricated with and without application of the method of this invention.

The devices fabricated in this manner from the differently surface treated silicon substrates of the four groups A, B, C and D were tested as solar cells for their open-circuit voltages ($V_{oc}$) using an air mass (AM) 1.5 solar light simulator employing a xenon lamp. The results obtained are shown in FIG. 3. As is clear from this figure, the specimens of groups C and D which were plasma processed in accordance with this invention exhibited substantially higher open-circuit voltages $V_{oc}$ than their counterparts in either group A, which had thin oxide films on the silicon substrate surfaces thereof, or in group B, which had only natural oxide films on the silicon substrate surface thereof. The effect of the present invention toward improving the characteristics of the solar cells was thus confirmed.

More detailed surface analysis showed that in some cases Si-O bonding remained on the surface of crystalline silicon specimens surface treated in the same way as the specimens of group C. However, it was also confirmed that carbon, one cause of contamination, was reliably removed and that phosphorus atoms adhered to the silicon surface.

Therefore, it is thought that in this example a more important role is played by the effect of removing nonoxide contaminants and the effect of surface protection than by the effect of eliminating oxide bonding to the silicon.

While in the aforesaid example, an amorphous silicon film was deposited on the crystalline silicon substrate, the present invention can also be similarly applied in the case of depositing an amorphous silicon film on an amorphous silicon material and in the case of forming a Schottky junction on an amorphous silicon material by deposition of gold (Au) or the like thereon. In the formation of a Schottky junction, the phosphine gas plasma treatment of the silicon substrate according to this invention has a particularly great effect toward reducing reverse current flow, increasing the breakdown voltage and otherwise improving the rectifier characteristics.

In addition, a silicon substrate that has been plasma treated in accordance with this invention exhibits stronger resistance to surface contamination by impurities and thus benefits from what might be called a preliminary protection effect. For instance, a crystalline silicon substrate processed in the manner described earlier with respect to FIG. 1 was removed from the processing chamber 10 so as to allow the surface thereof to become naturally contaminated. At this time phosphorus oxides and carbon adhered to the surface of the specimen. The specimen was then returned to the high-vacuum chamber and heated to around 400°–500° C., whereby the contaminants on the specimen surface were sublimated together with the phosphorus oxides and there was again obtained a clean crystalline silicon substrate. This processing step can be effectively employed for retreating silicon substrates in a vacuum apparatus which cannot be used for conducting plasma treatment.

While phosphine was used as the gas for plasma treatment in all of the foregoing examples, it is also possible in this invention to use such other gases as diborane ($B_2H_6$), silane tetrafluoride ($SiF_4$) and the like. It is thus possible to avoid use of gases such as chlorine and hydrogen chloride which, because of their corrosive nature, give rise to maintenance problems. It should be noted, however, that when diborane is used, the temperature of the substrate being treated is somewhat higher than in the case of the other gases.

In another example in which diborane gas was used instead of phosphine gas for treating the (100) surface of an n-type crystalline silicon substrate by the method of the present invention and in which a p-type amorphous silicon layer was deposited using $SiH_4$ and $B_2H_6$, another improvement in device characteristics was observed. The substrate temperature during the plasma treatment in this case was around 200°-350° C. and the chamber pressure was 0.1-5 torr. As will be noted, a solar cell fabricated using the plasma treated substrate exhibited a significantly improved fill factor (F.F.).

Further, while plasma excitation was used for gas excitation in all of the foregoing examples, the excitation can alternately be conducted by use of ultraviolet rays, X-rays or an electron beam.

At any rate, by the method of the present invention it is possible to effectively remove impurities from the surface of a silicon substrate, be it crystalline or non-crystalline, and to provide good protection for the surface with phosphorus, boron or the like. Moreover, the method has extremely high practicability since the steps thereof can be carried out without need for an ultra-high vacuum or for a highly corrosive gas. Furthermore, other structures formed on the surface of a material that has been treated to a high degree of perfection according to the present invention exhibit various improved electrical, physical and chemical characteristics. As a result, the invention leads to improvements in the performance and yield of the entire integrated semiconductor circuit.

What is claimed is:

1. A method for treating the surface of silicon comprising the steps of maintaining a silicon material in a non-oxidating atmosphere with a reduced pressure, exciting a gas selected from among hydrides of phosphorus, fluorides of phosphorus, hydrides of arsenic, fluorides of arsenic, hydrides of boron, fluorides of boron and fluorides of silicon and supplying the excited gas onto the surface of the silicon material for a prescribed period of time, and during this time maintaining the temperature of the silicon material within a range higher than the temperature at which the molecules of the selected gas would, were the gas not excited, liquefy at the reduced pressure and deposit on the material and lower than the temperature at which the gas decomposes.

2. A method in accordance with claim 1, wherein the selected gas is excited by plasma excitation.

3. A method in accordance with claim 1, wherein the selected gas is excited by ultraviolet ray excitation.

4. A method in accordance with claim 1, wherein the selected gas is excited by X-ray excitation.

5. A method in accordance with claim 1, wherein the selected gas is excited by electron beam excitation.

6. A method in accordance with claim 1, wherein the pressure of the non-oxidating atmosphere is of the order of 0.1-5 Torr, the excited gas is plasma-excited phosphine gas, and the temperature at which the silicon material is maintained is about 150°-300° C.

7. A method in accordance with claim 1, wherein the pressure of the non-oxidizing atmosphere is of the order of 0.1-5 Torr, the excited gas is plasma-excited diborane gas, and the temperature at which the silicon material is maintained is about 200°-350° C.

8. A method for treating the surface of silicon comprising the steps of, in a process conducted immediately before epitaxially growing a crystalline semiconductor layer on the surface of a crystalline semiconductor material, maintaining the silicon material in a non-oxidizing atmosphere with a reduced pressure, exciting a gas selected from among hydrides of phosphorus, fluorides of phosphorus, hydrides of arsenic, fluorides of arsenic, hydrides of boron, fluorides of boron and fluorides of silicon and supplying the excited gas onto the surface of the silicon material for a prescribed period of time, and during this time maintaining the temperature of the silicon material within a range higher than the temperature at which the molecules of the selected gas would, were the gas not excited, liquefy at the reduced pressure and deposit on the material and lower than the temperature at which the gas decomposes.

9. A method in accordance with claim 8, wherein the selected gas is excited by plasma excitation.

10. A method in accordance with claim 8, wherein the selected gas is excited by ultraviolet ray excitation.

11. A method in accordance with claim 8, wherein the selected gas is excited by X-ray excitation.

12. A method in accordance with claim 8, wherein the selected gas is excited by electron beam excitation.

13. A method in accordance with claim 8, wherein the pressure of the non-oxidizing atmosphere is of the order of 0.1-5 Torr, the excited gas is plasma-excited phosphine gas, and the temperature at which the silicon material is maintained is about 150°-300° C.

14. A method according to claim 13, further comprising the step of sublimating phosphorus from the surface of the treated silicon material by heating the silicon to 400°-500° C. after treating the surface of the silicon material and before epitaxially growing a crystalline semiconductor layer on the surface thereof.

15. A method in accordance with claim 8, wherein the pressure of the non-oxidizing atmosphere is of the order of 0.1-5 Torr, the excited gas is plasma-excited diborane gas, and the temperature at which the silicon material is maintained is about 200°-350° C.

16. A method for treating the surface of silicon comprising the steps of, in a process conducted immediately before depositing a material forming a junction exhibiting rectifier characteristics or ohmic characteristics on the surface of a crystalline semiconductor material, maintaining the silicon material in a non-oxidizing atmosphere with a reduced pressure, exciting a gas selected from among hydrides of phosphorus, fluorides of phosphorus, hydrides of arsenic, fluorides of arsenic, hydrides of boron, fluorides of boron and fluorides of silicon and supplying the excited gas onto the surface of the silicon material for a prescribed period of time, and during this time maintaining the temperature of the silicon material within a range higher than the temperature at which the molecules of the selected gas would, were the gas not excited, liquefy at the reduce pressure and deposit on the material and lower than the temperature at which the gas decomposes.

17. A method in accordance with claim 16, wherein the selected gas is excited by plasma excitation.

18. A method in accordance with claim 16, wherein the selected gas is excited by ultraviolet ray excitation.

19. A method in accordance with claim 16, wherein the selected gas is excited by X-ray excitation.

20. A method in accordance with claim 16, wherein the selected gas is excited by electron beam excitation.

21. A method in accordance with claim 16, wherein the pressure of the non-oxidizing atmosphere is of the order of 0.1-5 Torr, the excited gas is plasma-excited phosphine gas, and the temperature at which the silicon material is maintained is about 150°-300° C.

22. A method in accordance with claim 16, wherein the pressure of the non-oxidizing atmosphere is of the order of 0.1-5 Torr, the excited gas is plasma-excited diborane gas, and the temperature at which the silicon material is maintained is about 200°–350° C.

23. A method for treating the surface of silicon comprising the steps of, in a process conducted immediately before depositing an amorphous semiconductor on the surface of a crystalline semiconductor material, maintaining the silicon material in a non-oxidizing atmosphere with a reduced pressure, exciting a gas selected from among hydrides of phosphorus, fluorides of phosphorus, hydrides of arsenic, fluorides of arsenic, hydrides of boron, fluorides of boron and fluorides of silicon and supplying the excited gas onto the surface of the silicon material for a prescribed period of time, and during this time maintaining the temperature of the silicon material within a range higher than the temperature at which the molecules of the selected gas would, were the gas not excited, liquefy at the reduced atmosphere and deposit on the material and lower than the temperature at which the gas decomposes.

24. A method in accordance with claim 23, wherein the selected gas is excited by plasma excitation.

25. A method in accordance with claim 23, wherein the selected gas is excited by ultraviolet ray excitation.

26. A method in accordance with claim 23, wherein the selected gas is excited by X-ray excitation.

27. A method in accordance with claim 23, wherein the selected gas is excited by electron beam excitation.

28. A method in accordance with claim 23, wherein the pressure of the non-oxidizing atmosphere is of the order of 0.1–5 Torr, the excited gas is plasma-excited phosphine gas, and the temperature at which the silicon material is maintained is about 150°–300° C.

29. A method in accordance with claim 23, wherein the pressure of the non-oxidizing atmosphere is of the order of 0.1–5 Torr, the excited gas is plasma-excited diborane gas, and the temperature at which the silicon material is maintained is about 200°–350° C.

30. A method for treating the surface of silicon comprising a first surface treatment and a second surface treatment, the first surface treatment comprising the steps of exciting a gas selected from among hydrides of phosphorus, fluorides of phosphorus, hydrides of arsenic, fluorides of arsenic, hydrides of boron, fluorides of boron and fluorides of silicon and supplying the excited gas onto the surface of the silicon material for a prescribed period of time, and during this time maintaining the temperature of the silicon material within a range higher than the temperature at which the molecules of the selected gas would, were the gas not excited, liquefy at the reduced pressure and deposit on the material and lower than the temperature at which the gas decomposes, and the second treatment step comprising the step of again subjecting the silicon material treated in the first treatment step to heat treatment in a reduced-pressure atmosphere after it has been exposed to an unclean atmosphere.

31. A method in accordance with claim 30, wherein the selected gas is excited by plasma excitation.

32. A method in accordance with claim 30, wherein the selected gas is excited by ultraviolet ray excitation.

33. A method in accordance with claim 30, wherein the selected gas is excited by X-ray excitation.

34. A method in accordance with claim 30, wherein the selected gas is excited by electron beam excitation.

35. A method in accordance with claim 30, wherein the pressure of the non-oxidizing atmosphere is of the order of 0.1–5 Torr, the excited gas is plasma-excited phosphine gas, and the temperature at which the silicon material is maintained is about 150°–300° C.

36. A method in accordance with claim 30, wherein the pressure of the non-oxidizing atmosphere is of the order of 0.1–5 Torr, the excited gas is plasma-excited diborane gas, and the temperature at which the silicon material is maintained is about 200°–350° C.

37. A method in accordance with claim 30, wherein the temperature of the silicon material in the second treatment step is about 400°–500° C.

* * * * *